United States Patent [19]
Snyder et al.

[11] Patent Number: 5,703,758
[45] Date of Patent: Dec. 30, 1997

[54] ELECTRONIC DEVICE CASING INCLUDING LIVING SPRING BUTTON AND METHOD

[75] Inventors: Thomas D. Snyder, Raleigh; L. Nelson Wakefield, Cary, both of N.C.

[73] Assignee: Ericsson Inc., Research Triangle Park, N.C.

[21] Appl. No.: 713,509

[22] Filed: Sep. 13, 1996

[51] Int. Cl.$^6$ .................................................. H05K 5/00
[52] U.S. Cl. ........................ 361/752; 361/787; 361/769
[58] Field of Search ................................. 361/752, 753, 361/736, 796, 769, 781, 787, 800, 814, 816, 818; 174/35 GC, 53, 54–58

[56] References Cited

U.S. PATENT DOCUMENTS 5,345,700  9/1994  Norment .................................. 36/139
5,530,626  6/1996  Norment ................................. 361/814

*Primary Examiner*—Leo P. Picard
*Assistant Examiner*—Anthony Dinkins
*Attorney, Agent, or Firm*—Nixon & Vanderhye P.C.

[57] ABSTRACT

A spring button assembly is integrally formed with a casing for an electronic device. The spring button assembly includes a press button disposed facing an exterior of the casing, the PCB contact extension disposed facing an interior of the casing, and a resilient connector connecting the press button and the PCB contact extension to the casing. The casing can be molded with many different configurations of the spring button assembly, enabling the button to be placed far from its corresponding PCB contact including around complex geometry. The PCB contact extension may be configured to actuate a contact switch on the PCB or may be provided with a conductive surface to connect conductive traces on the PCB. In one arrangement, the PCB contact extension includes a cam surface adapted to engage a contact block for activating the PCB contact. In yet another arrangement, the button assembly includes components to be an LED indicator.

14 Claims, 3 Drawing Sheets

ELECTRONIC DEVICE CASING INCLUDING LIVING SPRING BUTTON AND METHOD

BACKGROUND OF THE INVENTION

The present invention relates to electronic devices and, in particular, to a casing for an electronic device including an integral spring button that is formed with the casing.

Many electronic (and other) devices incorporate buttons into their assemblies to provide the user with a means for activating or changing a functionality of the device. The button is a proven, common and often necessary device. Size, cost, complexity, assembly and/or geometry constraints can make it difficult, undesirable or impossible to incorporate a button in any of its current embodiments into the device.

Typically, proposed designs addressing the considerations noted above have drawbacks. These designs are often tradeoffs between button location (geometry) and cost or size and assembly complexity. For example, it may be desirable to put a button in a particular location on a very small portable electronic device. Unfortunately, in this location, there may not be enough room to create locking, holding and guiding features for the button, as well as have space for the button itself or access to its respective switch on the printed circuit board (PCB). Possible solutions often require sacrifices in size, button location or assembly. There are, of course, many other situations for which no ideal button solution previously existed.

SUMMARY OF THE INVENTION

The electronic device casing according to the present invention solves the shortcomings noted above. In accordance with the invention, a button is incorporated integrally into the device casing and includes a so-called "living spring" connecting the two. In this context, the cost of the added button would be practically nothing as the button could be incorporated into a plastic housing tool without adding complexity to the tool's production or operation. Concurrently, the cost of tooling, manufacturing and assembling a separate button is eliminated, which results in additional cost savings. In addition, the structure according to the present invention allows the button to be placed far from its corresponding switch on the PCB and may also be configured around complex geometry.

By virtue of the integral assembly, at least one assembly step is removed from the assembly process. Still further, since the button and housing are now a single part, there is no tolerance stack up between these components to account for, which helps to increase production yield. With respect to reliability, by virtue of the integral structure, there are fewer components that can break or malfunction. Moreover, the buttons and living springs of this configuration can be implemented in a very small area.

In accordance with an exemplary embodiment of the invention, there is provided a casing for an electronic device. The electronic device includes a printed circuit board (PCB) having a plurality of designated contacts. The casing includes a spring button assembly formed integral therewith. The spring button assembly has a press button disposed facing an exterior of the casing, a PCB contact extension disposed facing an interior of the casing, and a resilient connector connecting the press button and the PCB contact extension to the casing. The PCB contact extension may include a conductive surface at an end thereof. In addition, the press button may be disposed in a plane different from the PCB. In one arrangement, the PCB contact extension includes a cam surface at an end thereof.

In accordance with another exemplary aspect of the invention, there is provided an electronic device including a PCB having a plurality of designated contacts, and the casing according to the present invention. The device may additionally include a contact block having a block cam surface disposed adjacent the PCB extension. The contact block activates one of the PCB contacts when displaced in a first direction. In this regard, the PCB extension includes an extension cam surface at an end thereof facing the block cam surface such that when the extension cam surface is displaced in a second direction substantially perpendicular to the first direction, the extension cam surface engages the block cam surface and displaces the contact block in the first direction. The device may also include a button cap disposed over the press button. The button cap is preferably substantially transparent, and a lamp may be disposed inside the casing adjacent the button cap.

In accordance with yet another exemplary aspect of the invention, there is provided a method of making a casing for an electronic device. The method includes molding the casing with a moldable material and integrally molding the spring button assembly therewith.

BRIEF DESCRIPTION OF THE DRAWINGS

These and other aspects and advantages of the present invention will be described in detail with reference to the accompanying drawings, in which.

DETAILED DESCRIPTION OF PREFERRED EMBODIMENTS

Figure 1:
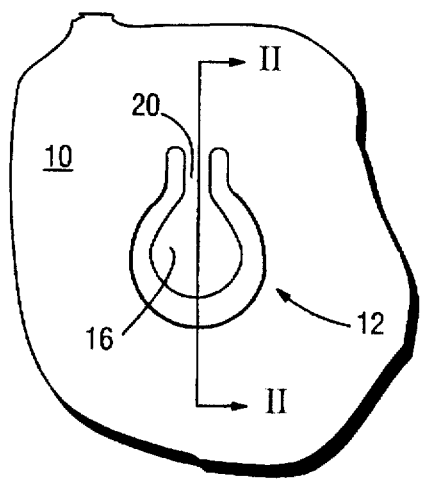
FIG. 1 is a plan view of an exemplary casing according to the present invention including a spring button assembly.
Figure 2:
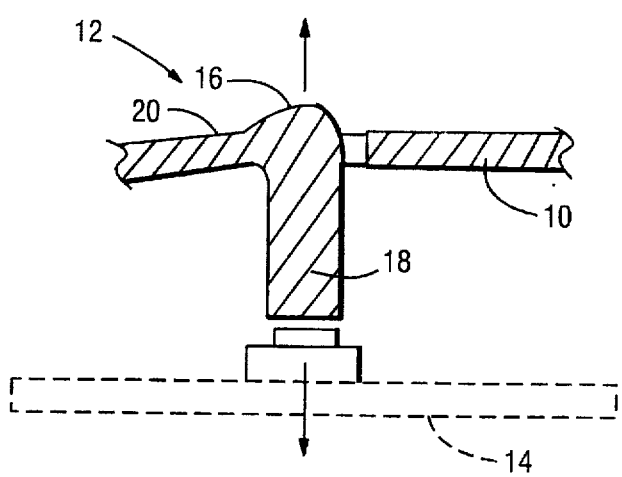
FIG. 2 is a cross-sectional view along line II—II in FIG. 1.

The present invention particularly relates to a spring button assembly in a casing for an electronic device. Referring to FIGS. 1 and 2, an exemplary spring button assembly of an electronic device casing is shown. The casing 10 is preferably molded from a plastic material or other moldable material. A spring button assembly 12 is formed integrally with the casing 10 preferably during molding of the casing. The casing is sized to receive a printed circuit board (PCB) 14 of the electronic device.

Typically, the PCB 14 dictates the size of the electronic device as well as the component orientation. As noted above, it is not always feasible to locate a button in the vicinity of its corresponding contact on the PCB 14. The casing 10 according to the present invention thus incorporates the spring button assembly 12 formed integrally with the casing 10. The spring button assembly 12 includes a press button 16 disposed facing an exterior of the casing 10, a PCB contact extension 18 disposed facing an interior of the casing in the vicinity of a respective one of the PCB contacts, and a resilient connector 20 or living spring that connects the press button 16 and the PCB contact extension 18 to the casing 10.

In use, the resilient connector 20 supports the press button 16 and PCB contact extension 18 such that a distal end of the PCB contact extension faces its respective PCB contact. When a user presses the press button 16, the distal end of the PCB contact extension 18 engages the respective PCB contact. When the user releases the press button 16, the resilient connector retracts the PCB contact extension 18 from the respective PCB contact. By virtue of this structure, a button can be formed during the same process as casing formation that does not require typical button assembly components such as guides, cams, holding features and the like.

Figure 3:
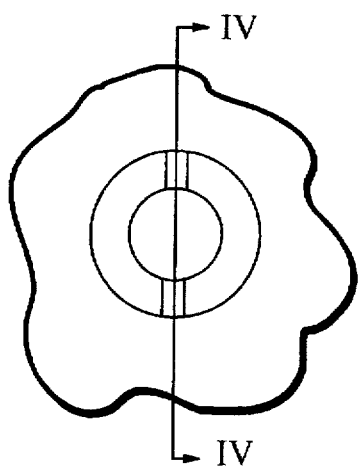
FIG. 3 is a plan view of an alternative spring button assembly according to the invention.
Figure 4:
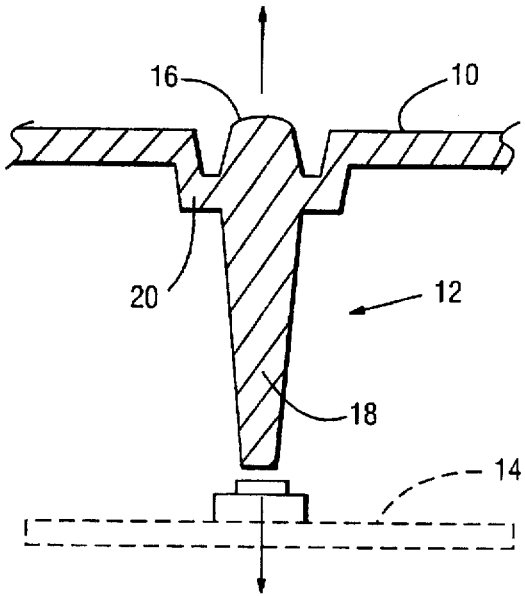
FIG. 4 is a cross-sectional view along line IV—IV in FIG. 3.

FIGS. 3 and 4 illustrate an alternative exemplary configuration of the spring button assembly 12 according to the invention. In FIGS. 3 and 4, like reference numerals are used to illustrate like elements. In this configuration, the press button 16 is disposed in an aperture in the casing, and the press button 16 and PCB contact extension 18 are integrally supported thereto by the resilient connector 20. With this arrangement, the PCB contact extension 18 is disposed directly in line with its corresponding PCB contact.

Figure 5:
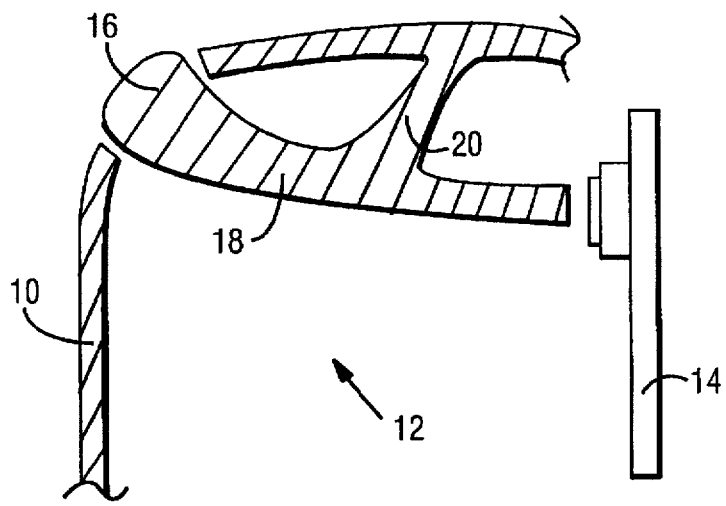
FIG. 5 is a cross-sectional view of an alternative spring button assembly configuration according to the invention.

FIG. 5 illustrates an exemplary configuration where the press button 16 is disposed in a plane different from the PCB 14. Of course, those of ordinary skill in the art will contemplate other configurations of the spring button assembly 12 to achieve desired button parameters, and the invention is not meant to be limited to the configurations that are shown in the FIGURES.

Figure 6:
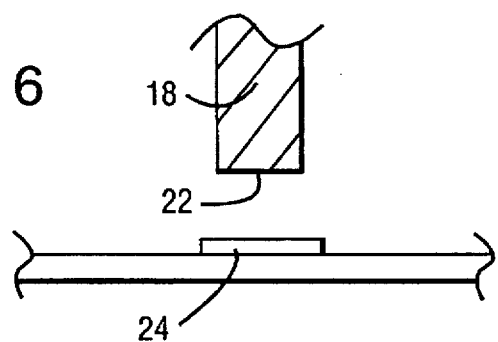
FIG. 6 illustrates an alternative electrical connector for the spring button assembly.

In FIGS. 2 and 4, the PCB contacts relating to the electronic device features that are activated by the spring button assembly are preferably switch type contacts, such as dome-type contacts, which are activated by PCB contact extension impact. In an alternative arrangement, as shown in FIG. 6, a distal end of the PCB contact extension 18 is provided with a conductive layer 22. In this regard, the PCB contacts include disconnected conductive traces 24, wherein the conductive surface 22 serves as a connecting bridge between the conductive traces 24 when the PCB contact extension 18 contacts the conductive traces 24. As an alternative to layering the conductive material 22 over the distal end of the PCB contact extension 18, the button assembly itself may be made from a conductive material.

Figure 7:
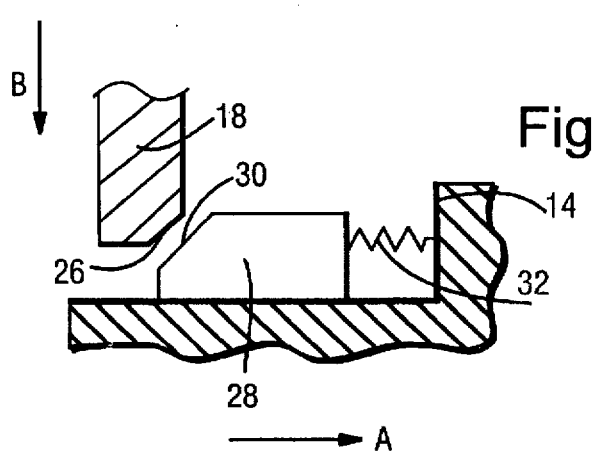
FIG. 7 illustrates an alternative spring button assembly including a cam surface deflection feature.

FIG. 7 illustrates yet another alternative configuration according to the present invention. In this configuration, the PCB contact extension 18 is provided with an extension cam surface 26 at its distal end. The PCB contact is activated by a contact block 28 that is displaced in a first direction indicated by arrow A in contact with the PCB 14. The contact block 24 includes a block cam surface 30 disposed adjacent the PCB extension 18 and the extension cam surface 26. A spring 32 is disposed between the contact block 28 and the PCB 14, urging the contact block 28 away from the PCB. When the PCB contact extension 18 is displaced in a second direction indicated by arrow B, which is substantially perpendicular to the first direction, the extension cam surface 26 engages the block cam surface 30 and displaces the contact block 28 in the first direction to actuate the PCB contact. When the button is released and the PCB contact extension 18 returns to its original position, the spring 32 urges the contact block 28 away from the PCB 14. Of course, the spring 32 may be constituted by the switch itself, such as a dome element in a microswitch or the like.

Figure 8:
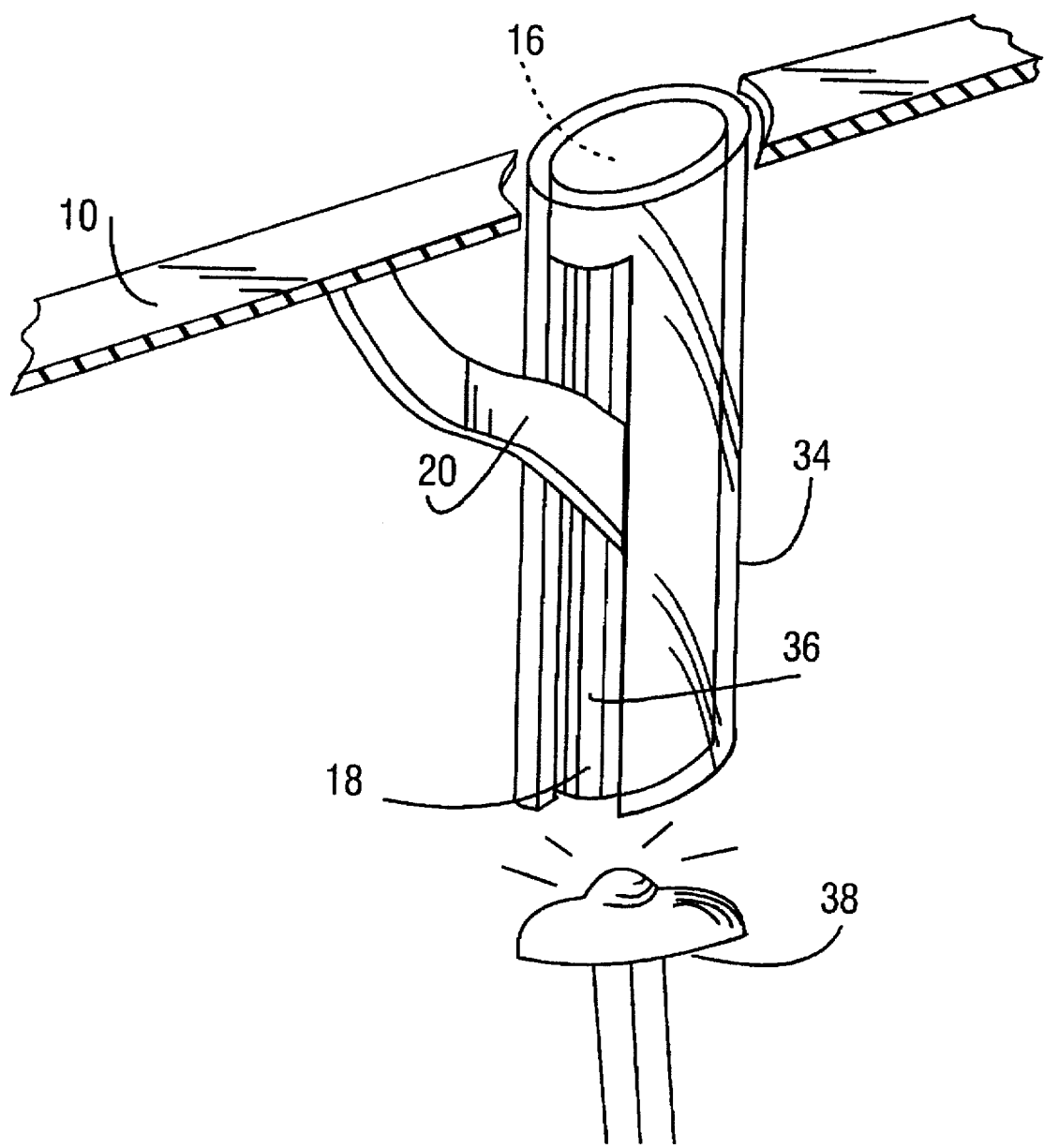
FIG. 8 illustrates the spring button assembly according to the invention configured as an LED indicator.

The spring button assembly 12 according to the invention can be adapted to an LED indicator. As shown in FIG. 8, a button cap 34 having a slot 36 therein is disposed over the press button 16 and PCB contact extension 18. The resilient connector 20 is received in the slot 36. An LED lamp 38 is disposed in the vicinity of the button cap to illuminate the button cap 34. Preferably, the button cap is transparent to maximize the lamp's 38 output.

In accordance with the present invention, a low-cost spring button assembly can be integrally formed with a casing for an electronic device. The structure allows a button to be placed far from its corresponding PCB contact including around complex geometry. Moreover, the number of pieces is reduced, tolerances are removed thereby increasing production yield, and fewer components are susceptible to breakage or malfunction.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A casing for an electronic device, the electronic device including a printed circuit board (PCB) having a plurality of designated contacts, the casing comprising a spring button assembly formed integral therewith, said spring button assembly having a press button disposed facing an exterior of the casing, a PCB contact extension disposed facing an interior of the casing, and a resilient connector connecting said press button and said PCB contact extension to the casing.

2. A casing according to claim 1, wherein said PCB extension comprises a conductive surface at an end thereof.

3. A casing according to claim 1, wherein said press button is disposed in a plane different from the PCB.

4. A casing according to claim 1, wherein said PCB extension comprises a cam surface at an end thereof.

5. An electronic device comprising:
   a PCB having a plurality of designated contacts; and
   a casing housing said PCB, said casing including a spring button assembly formed integral therewith, said spring button assembly having a press button disposed facing an exterior of said casing, a PCB contact extension disposed adjacent a respective one of said PCB contacts, and a resilient connector connecting said press button and said PCB contact extension to said casing.

6. An electronic device according to claim 4, wherein at least said respective one of the PCB contacts comprises a switch that is activated by PCB contact extension impact.

7. An electronic device according to claim 4, wherein said PCB extension comprises a conductive surface at an end thereof facing said respective one of said PCB contacts, said respective one of said PCB contacts comprising disconnected conductive traces, wherein said conductive surface serves as a connecting bridge between said conductive traces when said PCB contact extension contacts said conductive traces.

8. An electronic device according to claim 4, wherein said press button is disposed in a plane different from said PCB.

9. An electronic device according to claim 4, further comprising a contact block having a block cam surface disposed adjacent said PCB extension, said contact block activating said respective one of the PCB contacts when displaced in a first direction, wherein said PCB extension comprises an extension cam surface at an end thereof facing said block cam surface such that when said extension cam surface is displaced in a second direction substantially perpendicular to said first direction, said extension cam surface engages said block cam surface and displaces said contact block in said first direction.

10. An electronic device according to claim 4, further comprising a button cap disposed over said press button.

11. An electronic device according to claim 10, further comprising a lamp disposed inside said casing adjacent said button cap, wherein said button cap is substantially transparent.

12. A method of making a casing for an electronic device, comprising molding the casing with a moldable material and integrally molding a spring button assembly therewith, the spring button assembly including a press button formed facing an exterior of the casing, a PCB contact extension formed facing an interior of the casing, and a resilient connector formed connecting the press button and the PCB contact extension to the casing.

13. A method according to claim 8, further comprising attaching a conductive material to a distal end of the PCB contact extension.

14. A method according to claim 8, further comprising forming a cam surface at a distal end of the PCB contact extension.

* * * * *

UNITED STATES PATENT AND TRADEMARK OFFICE
CERTIFICATE OF CORRECTION

PATENT NO. : 5,703,758
DATED : December 30, 1997
INVENTOR(S) : SNYDER et al.

It is certified that error appears in the above-identified patent and that said Letters Patent is hereby corrected as shown below:

Column 4, claim 6, line 1, replace "4" with -- 5 --.

Column 4, claim 7, line 1, replace "4" with -- 5 --.

Column 4, claim 8, line 1, replace "4" with -- 5 --.

Column 4, claim 9, line 9, replace "4" with -- 5 --.

Column 5, claim 10, line 1, replace "4" with -- 5 --.

Column 6, claim 13, line 1, replace "8" with -- 12 --.

Column 6, claim 14, line 1, replace "8" with -- 12 --.

Signed and Sealed this

Twenty-sixth Day of May, 1998

Attest:

BRUCE LEHMAN

*Attesting Officer*                *Commissioner of Patents and Trademarks*